United States Patent [19]
Koshizuka

[11] Patent Number: 4,634,900
[45] Date of Patent: Jan. 6, 1987

[54] SENSE AMPLIFIER

[75] Inventor: Atuo Koshizuka, Kawasaki, Japan

[73] Assignee: Fujitsu Limited, Kawasaki, Japan

[21] Appl. No.: 648,507

[22] Filed: Sep. 10, 1984

[30] Foreign Application Priority Data

Sep. 17, 1983 [JP] Japan ............................... 58-171683

[51] Int. Cl.$^4$ .......................... H03K 5/24; G11C 7/06
[52] U.S. Cl. ................................... 307/530; 365/190; 365/208; 307/357
[58] Field of Search ............... 307/530, 449, 463, 355, 307/357; 365/189, 190, 207, 208

[56] References Cited

U.S. PATENT DOCUMENTS 3,879,621  4/1975  Cavaliere et al. ................... 307/530
4,376,987  3/1983  Hsia ................................ 307/530 X
4,504,748  3/1985  Oritani ............................ 307/530

FOREIGN PATENT DOCUMENTS 2261254  7/1974  Fed. Rep. of Germany ...... 307/530

OTHER PUBLICATIONS

Boysel et al, "Multiphase Clocking Achieves 100-Nsec MOS Memory"; *EDN*; 6/10/1968; pp. 51-55.

*Primary Examiner*—Larry N. Anagnos
*Attorney, Agent, or Firm*—Staas & Halsey

[57] ABSTRACT

A sensor amplifier of a differential amplifier type having an input selecting function. The sense amplifier has a pair of input circuit portions receiving a plurality of pairs of complementary input signals, one of the input circuit portions has a plurality of circuit units each generating the amplified output of one of a pair of complementary input signals in response to an address signal applied thereto, and the other input circuit portion comprising a plurality of circuit units each generating the amplified output of the other one of the pair of complementary input signals in response to the address signal applied thereto. The sense amplifier selects one of a plurality of pairs of complementary input signals, i.e., complementary signals on bit lines or on data buses, in accordance with the address signal and generates an output signal corresponding to a selected pair of complementary input signals.

9 Claims, 3 Drawing Figures

SENSE AMPLIFIER

BACKGROUND OF THE INVENTION

The present invention relates to a sense amplifier used, for example, in a static-type semiconductor memory device, one of the functions of the sense amplifier being to select one of a plurality of input signals.

In a static-type RAM device, a very small voltage difference of, for example, about 0.5 V, output from a memory cell and transmitted to a pair of data buses, is amplified by a sense amplifier when readout operation is effected.

However, in a conventional static-type RAM device, especially a large capacity RAM device, since a bit line pair, column transfer gates, and a data bus pair are connected to a selected memory cell, the load of the memory cell becomes heavy, and the readout speed is deteriorated. Especially, in a large capacity RAM device, each bit line and data bus become long and thin, and the on-resistance of the column transfer gates becomes large. Therefore, if the driveability of each memory cell is not large, it takes a long time for the input signal of the sense amplifier to reach a steady state signal level.

SUMMARY OF THE INVENTION

It is an object of the present invention to decrease the load of each selected memory cell and to speed up the operation speed of a semiconductor memory device.

According to the present invention, there is provided a sense amplifier of a differential amplifier type having a pair of input circuit portions receiving a plurality of pairs of complementary input signals, one of the input circuit portions comprising a plurality of circuit units each generating the amplifier output of one of each of a plurality of complementary input signals in response to an address signal applied thereto, and the other input circuit portion comprising a plurality of circuit units each generating the amplified output of one of the other ones of the pairs of complementary input signals in response to the address signal applied thereto, the sense amplifier selecting one of a plurality of pairs of complementary input signals in accordance with the address signal and generating an output signal corresponding to a selected pair of complementary input signals.

DESCRIPTION OF THE PREFERRED EMBODIMENT

Before describing the preferred embodiments, an explanation will be given of a static-type RAM device using conventional sense amplifiers with reference to the drawings.

Figure 1:
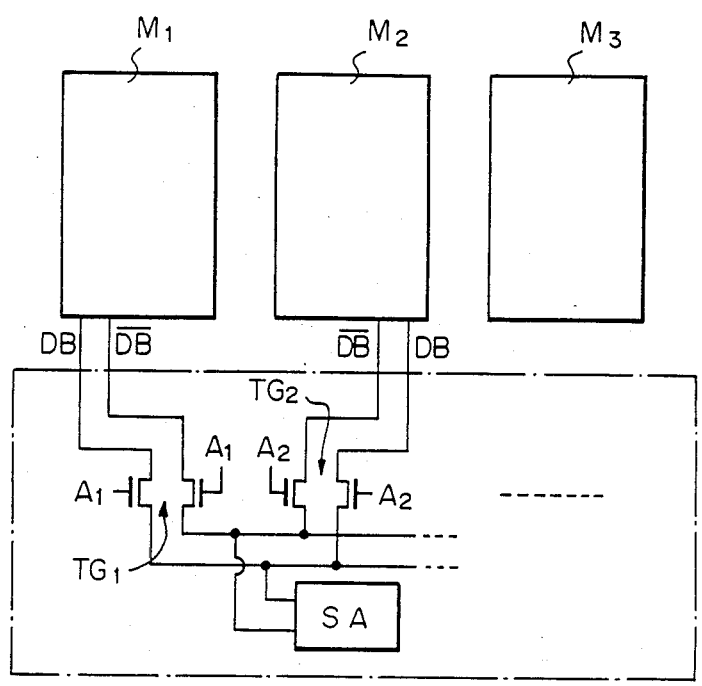
FIG. 1 is a block circuit diagram illustrating a conventional static-type RAM device.

FIG. 1 illustrates a general static-type RAM device in which one sense amplifier SA is provided for onememory chip, and memory cells therein are divided into a plurality of memory blocks $M_1$, $M_2$, --- In the memory device of FIG. 1, data bus pairs DB and $\overline{DB}$ (where $\overline{DB}$ is an inversion of DB) of each memory block $M_1$, $M_2$, --- are coupled together to a common sense amplifier SA via transfer gates $TG_1$, $TG_2$, ---, respectively. Therefore, it is possible to selectively connect the data bus pair DB and $\overline{DB}$ of each of the memory blocks $M_1$, $M_2$, --- to the sense amplifier SA by using address signals $A_1$, $A_2$, --- which are added to the transfer gates $TG_1$, $TG_2$, --- Each of the memory blocks $M_1$, $M_2$, --- comprises a matrix arrangement of a plurality of memory cells disposed at the intersections of word lines and bit lines, and it is necessary to increase the number of the memory blocks when a high operation speed and low power consumption are necessitated.

There is also known a memory device which comprises a sense amplifier for every data bus pair DB and $\overline{DB}$, i.e., for every memory block $M_i$, in which one of the output signals of the sense amplifiers is selected by using a selection logic circuit provided in the output portion of the sense amplifiers.

Figure 2:
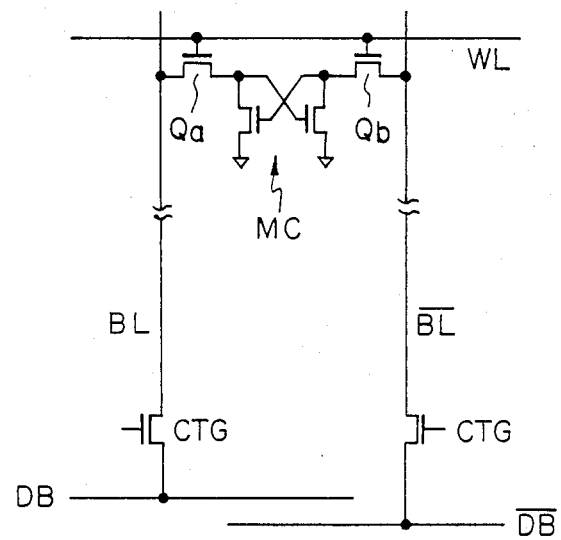
FIG. 2 is a schematic circuit diagram illustrating a circuit structure of each memory block used in the RAM device of FIG. 1.

In the cases mentioned above, as illustrated in FIG. 2, the loads of a selected memory cell MC are a bit line pair BL and $\overline{BL}$, and the data bus pair DB and $\overline{DB}$ which is connected to the bit line pair BL and $\overline{BL}$ via column transfer gates CTG, and the aforementioned transfer gates $TG_i$ in the case of the memory device of FIG. 1. Therefore, it takes a long time for the input signal of the sense amplifier to reach a steady state signal level if the drive ability of each memory cell MC, i.e., gm of the transistors constituting the memory cell MC, is small. Expecially, since each of the column transfer gates CTG and the transfer gates TG is not completely turned on even in a selected condition and has some resistance, the RC time constant of each transfer gate circuit becomes relatively large and the signal passing through the transfer gate circuit is delayed. In FIG. 2, WL designates a word line, and the input/output terminals of the memory cell MC composed of a flip-flop are connected to the bit lines BL and $\overline{BL}$ via transfer gate transistors $Q_a$ and $Q_b$, whose gate electrodes are connected to the word line WL. These transistors $Q_a$ and $Q_b$ also become the load of the memory cell MC.

As mentioned above, the device shown in FIGS. 1 and 2 has the disadvantages of a heavy load for each memory cell and a low operation speed.

According to the present invention, there is provided a sense amplifier which overcomes these problems, as described below.

Figure 3:
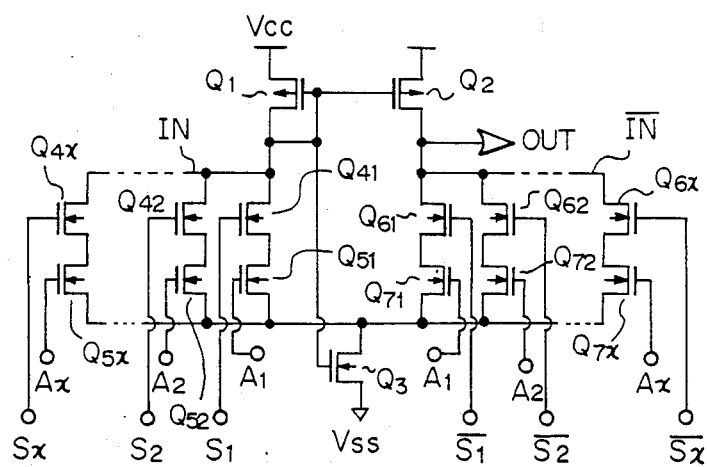
FIG. 3 is a circuit diagram illustrating a sense amplifier as an embodiment of the present invention.

FIG. 3 is a circuit diagram illustrating a CMOS type sense amplifier as an embodiment of the present invention. The sense amplifier comprises a pair of complementary input terminals IN and $\overline{IN}$, P-channel MOS transistors $Q_1$ and $Q_2$ operating as loads, an N-channel MOS transistor $Q_3$ operating as a constant current source, and an output terminal OUT. The sense amplifier of FIG. 3 further comprises x sets of series connections of N-channel MOS transistors $Q_{41}$ and $Q_{51}$, $Q_{42}$ and $Q_{52}$, ---, $Q_{4x}$ and $Q_{5x}$, which are mutually connected in parallel between the input terminal $\overline{IN}$ and the drain of the transistor $Q_3$, and x sets of series connections of N-channel MOS transistors $Q_{61}$ and $Q_{71}$, $Q_{62}$ and $Q_{72}$, ---, $Q_{6x}$ and $Q_{7x}$, which are mutually connected in parallel between the input terminal $\overline{IN}$ and the drain of the transistor $Q_3$. The transistors $Q_{51}$ and $Q_{71}$, $Q_{52}$ and $Q_{72}$, ---, $Q_{5x}$ and $Q_{7x}$ are controlled by the outputs $A_1$ through $A_x$ of an address decoder, respectively. The transistors $Q_{41}$, $Q_{42}$, ---, $Q_{4x}$ are controlled by input signals $S_1$, $S_2$, ---, $S_x$, respectively, and the transistors $Q_{61}$, $Q_{62}$, ---, $Q_{6x}$ are controlled by inverted input signals $\bar{S}_1, \bar{S}_2, \cdots, \bar{S}_x$, respectively. It should be noted that a conventional CMOS type sense amplifier comprises only the load transistor $Q_1$ and $Q_2$, the transistor $Q_3$, and one pair of driver transistors, such as $Q_{41}$ and $Q_{61}$, connected between the input terminal IN and the drain of the transistor $Q_3$ and between the input terminal $\overline{IN}$ and the drain of the transistor $Q_3$.

Where the sense amplifier of FIG. 3 is adapted to the memory device of FIG. 1, it is used as a substitute for the circuit portion surrounded by dot-dash line of FIG. 1. Therefore, the data buses DB and $\overline{DB}$ of the memory blocks $M_1, M_2, \cdots$ are connected to the gates of the transistors $Q_{41}$ and $Q_{61}$; $Q_{42}$ and $Q_{62}, \cdots, Q_{4x}$ and $Q_{6x}$, respectively.

As is apparent from FIG. 3, each set of the transistors $Q_{4i}$ and $Q_{5i}$ (i=1, 2, $\cdots$, x) composes an AND gate having two inputs $S_i$ and $A_i$, and each set of the transistors $Q_{6i}$ and $Q_{7i}$ composes an AND gate having two inputs $\bar{S}_i$ and $A_i$. Therefore, when the outputs $A_1$ through $A_x$ of the address decoder are all low, the transistors $Q_{51}, Q_{52}, \cdots, Q_{5x}$, and $Q_{71}, Q_{72}, \cdots, Q_{7x}$ are all turned off, and the sense amplifier is in a standby status.

When an output $A_i$ of the address decoder corresponding to the inputs $S_i$ and $\bar{S}_i$ becomes high, the potentials of the input terminals IN and $\overline{IN}$ become high and low, respectively, if the inputs $S_i$ and $\bar{S}_i$ are low and high, respectively, and become low and high, respectively, if the inputs $S_i$ and $\bar{S}_i$ are high and low, respectively. The potential of the output terminal OUT is the same as that of the input terminal $\overline{IN}$ and determined by the above relationships of the signals.

Where the sense amplifier is provided for every data bus pair DB and $\overline{DB}$, the inputs $S_i$ and $\bar{S}_i$, $S_2$ and $\bar{S}_2$, $\cdots$, $S_x$ and $\bar{S}_x$ are signals from the bit lines in a memory block, and the circuit of FIG. 3 is used as a column sense amplifier. The transistor pairs $Q_{51}$ and $Q_{71}$, $Q_{52}$ and $Q_{72}$, $\cdots$ $Q_{5x}$ and $Q_{7x}$ correspond to column transfer gates CTG. In this case, the load of each memory cell can be greatly decreased because the memory cell does not drive the data buses. It is also possible to combine the outputs of a plurality of column sense amplifiers into one circuit route by further using one stage of a sense amplifier having a similar constitution.

Although the CMOS type circuit was explained above, the present invention can be also adapted to an N-MOS type circuit and the like.

As mentioned above, according to the present invention, since each sense amplifier itself has the function of a selecting inputs, the load of each memory cell can be decreased when the sense amplifier is used as a column sense amplifier whose input terminals are connected to bit lines. When the sense amplifier is used as a sense amplifier whose input terminals are connected to data buses, it is possible to increase the readout speed because the transfer gates TG can be omitted. When the sense amplifiers are used in a two level hierarchical structure including a bit line stage and a data bus stage, it is possible to constitute a readout circuit stage having high response speed and simple connection patterns.

I claim:

1. A sense amplifier comprising
    a pair of input circuit portions, each said input circuit portion receiving a respective one of each of a plurality of pairs of complementary input signals,
    each said input circuit portion having a respective first terminal, at which said input circuit portions are commonly connected, and a second terminal,
    a first one of said input circuit portions including a plurality of circuit units each generating an amplifier output corresponding to the respective one of said input signals of a respective one of said pairs of said complementary input signals, in response to a respective address signal applied thereto, and the other input circuit portion comprising a plurality of circuit units each generating an amplifier output corresponding to the other one of each respective pair of said complementary input signals, in response to said respective address signal applied thereto,
    a constant current circuit connected between said commonly connected first terminals of said input circuit portions and to a first voltage level, and
    two load circuits, each being connected between a second voltage level and said second terminal of a respective one of said input circuit portions,
    wherein each said pair of complementary input signals is selected in accordance with the respective address signal and an output signal is provided from a predetermined one of said second terminals and corresponding to the respective selected pair of said complementary input signals, and power is provided to said sense amplifier by said first and second voltage levels.

2. A sense amplifier according to claim 1, wherein said sense amplifier is of the differential amplifier type.

3. A sense amplifier according to claim 1, wherein each of said load circuits comprises a MIS transistor, said constant current circuit comprises a MIS transistor, and the gates of the MIS transistors of said load circuits and the gate of the MIS transistor of said constant current circuit are commonly connected.

4. The amplifier of claim 3, wherein said gate of said MIS transistor of said constant current circuit is connected to said second terminal of a predetermined one of said input circuit portions, and the second terminal of the other input circuit portion is used as an output terminal.

5. A sense amplifier according to claim 1 or 3, wherein
    each of said circuit units comprises a serial connection of respective MIS transistors, a first one of which respective MIS transistors of each said serial connection receives the respective address signal at the gate thereof and the second of which receives a respective one of said complementary input signals at the gate thereof, and
    each of said input circuit portions is constituted by a parallel connection of the respective serial connections of said MIS transistors of the respective circuit units.

6. A sense amplifier according to claim 5, comprising a memory device with respective pluralities of pairs of bit lines, wherein each said bit line of said memory device is connected to the gate of a respective one of said respective MIS transistors of a respective one of said circuit units.

7. A sense amplifier according to claim 5, wherein the gates of said respective MIS transistors of said circuit units are connected to data buses of a memory device.

8. The amplifier of claim 5, each said circuit unit having only two of said respective MIS transistors of said circuit units.

9. The amplifier of claim 5, wherein each said serial connection of said first and second respective MIS transistors of said circuit units is connected between said commonly connected first terminals of said input circuit portions and the respective second terminal of the respective circuit portion.

* * * * *

UNITED STATES PATENT AND TRADEMARK OFFICE
CERTIFICATE OF CORRECTION

PATENT NO. : 4,634,900

DATED : January 6, 1987

INVENTOR(S) : Koshizuka

It is certified that error appears in the above-identified patent and that said Letters Patent is hereby corrected as shown below:

Front Page [57] ABSTRACT, line 1, "sensor" should be --sense--.

Col. 1, line 63, "onemem-" should be --one mem---;
       line 65, "--- In" should be -- ---. In--.

Col. 2, line 6,  "--- Each" should be -- ---. Each--;
       line 27, "drive ability" should be --driveability--;
       line 58, "IN" should --IN--.

Col. 3, line 59, "comprising" should be --comprising:--;
       line 68, "fier" should be --fied--.

Signed and Sealed this

Fourteenth Day of April, 1987

Attest:

DONALD J. QUIGG

Attesting Officer

Commissioner of Patents and Trademarks